United States Patent [19]

Van Der Werf

[11] Patent Number: 5,898,742
[45] Date of Patent: Apr. 27, 1999

[54] OPTIMAL DESIGN METHOD AND APPARATUS FOR SYNCHRONOUS DIGITAL CIRCUITS BY RETIMING THROUGH SELECTIVE FLIPFLOP POSITIONING AND ELECTRONIC CIRCUIT CONFIGURATION PRODUCED BY EXECUTING THE METHOD

[75] Inventor: Albert Van Der Werf, Eindhoven, Netherlands

[73] Assignee: U.S. Philips Corporation, New York, N.Y.

[21] Appl. No.: 08/146,751

[22] Filed: Nov. 2, 1993

[30] Foreign Application Priority Data

Nov. 2, 1992 [EP] European Pat. Off. ............. 92203362

[51] Int. Cl.⁶ ................................................. H04L 7/00
[52] U.S. Cl. ............................ 375/354; 371/1; 375/359
[58] Field of Search ............................ 375/354, 356, 375/371, 364, 351, 357, 359; 327/365, 379, 392, 403; 371/1; 348/524; 326/93

[56] References Cited

U.S. PATENT DOCUMENTS

| | | | |
|---|---|---|---|
| 4,833,695 | 5/1989 | Greub .................................. | 375/371 |
| 4,933,837 | 6/1990 | Freidin ................................ | 364/200 |
| 5,140,184 | 8/1992 | Hamamoto et al. ................. | 307/303.1 |
| 5,163,068 | 11/1992 | El-Amawy ........................... | 375/356 |
| 5,369,640 | 11/1994 | Watson et al. ...................... | 371/1 |
| 5,406,198 | 4/1995 | Orihashi et al. .................... | 324/158.1 |
| 5,418,360 | 5/1995 | Sokolowski et al. ............... | 250/227.12 |
| 5,438,259 | 8/1995 | Orihashi et al. .................... | 324/158.1 |

OTHER PUBLICATIONS

"Don't Get Skewed on Your Next ASIC Design" E. Ryherd, EDN Electrical Design News, vol. 36, No. 18 pp. 139–144.
"Retiming Synchronous Circuitry" CH.E. Leiserson et al, Algorithmica '91, pp. 5–35.

*Primary Examiner*—Wellington Chin
*Assistant Examiner*—William Luther
*Attorney, Agent, or Firm*—Debra K. Stephens; Jack Slobod

[57] ABSTRACT

Optimal design method and apparatus for synchronous digital circuits by retiming through selective flipflop positioning and electronic circuit configuration produced by executing the method. The method is for designing a synchronous digital electronic circuit that comprises cells and clocked flipflops interconnected by nets and running at a predetermined clock period, operates as follows. First, uniform-directedly as starting from any cell for any sub-path emanating therefrom its associated delay is accumulated. Next, if for such sub-path the accumulation result exceeds a predetermined integer number of clock periods. The sub-path in question is signalled for subsequent provision with such integer number of flipflops and its accumulation is terminated. Finally, all elementary cell-to-cell connections are provided with flipflops in minimal accordance with said signalling. The invention is particularly advantageous with large circuits such as used in digital video processors and with small clock periods.

17 Claims, 3 Drawing Sheets

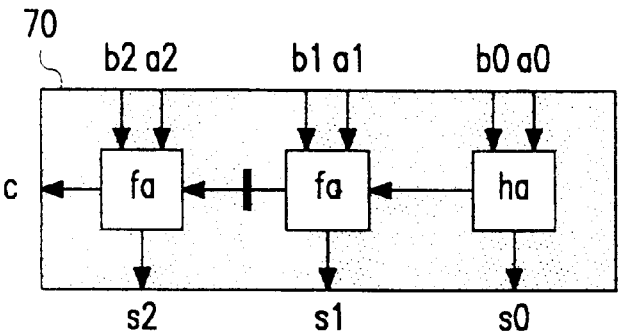
FIG.4
FIG.5
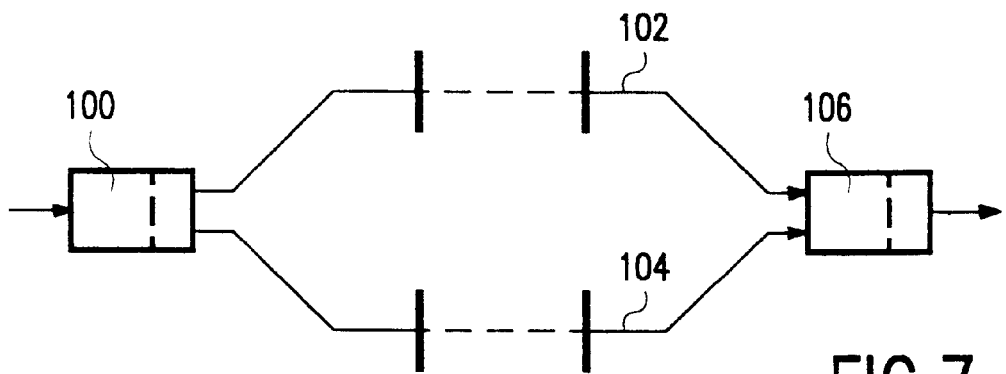
FIG.7

OPTIMAL DESIGN METHOD AND APPARATUS FOR SYNCHRONOUS DIGITAL CIRCUITS BY RETIMING THROUGH SELECTIVE FLIPFLOP POSITIONING AND ELECTRONIC CIRCUIT CONFIGURATION PRODUCED BY EXECUTING THE METHOD

BACKGROUND TO THE INVENTION

The invention relates to a method for designing a synchronous digital electronic circuit that comprises cells and clocked flipflops interconnected by nets and running at a predetermined clock period, through selective positioning of said flipflops, wherein any cell of the circuit imparts to a path between an input/output pair of the cell a respective signal delay, and wherein in-circuit paths imparting a total delay above said clock period are being provided with at least one flipflop. If the granularity considered in the design of the circuit is fine, a cell or node may be an essentially unclocked combinatorial element. In case of coarser granularity a node may comprise one or more clocked elements, or broader, sequentially operating elements. Moreover, the relevance of the clocked element may depend on the actual signal path through the node considered, as will be explained hereinafter. A method according to the preamble has been described in the paper 'Retiming Synchronous Circuitry' by Ch. E. Leiserson and J. B. Saxe, published in Algorithmica '91 pp. 5–35. Especially the introduction of Digital Signal Processing (DSP) for video signals has increased the requirements for signal throughput, which would in fact necessitate putting flipflops closer to each other, in terms of the number of interposed cells. A particular technique in the reference is repositioning of the flipflops or "retiming" to enhance the performance, and in particular, allowing for higher clock frequencies. A subset or special case of retiming is pipelining. These two techniques will be discussed hereinafter. According to the reference, circuit latency is not increased. The reference operates by setting up matrices of inter-cell signal delays and providing flipflops to all inter-cell paths that show a delay time that is larger than one clock period. Subsequently, the flipflops are subjected to retiming or shifting. However, the solving of the many conditions is not efficient for large circuits, inter alia, because of the lengthy path that may interconnect an arbitrary pair of cells, and the great number of such conditions in view of the great number of cells.

SUMMARY OF THE INVENTION

Accordingly, it is inter alia an object of the invention to provide a method for effecting the placement of the flipflops that within a short processing time leads to an optimum solution. The insight provided by the invention is that due to the relatively high clock frequency, the number of cells between successive flipflops would not be high, so that a more localized solution of the problem is much faster than an overall one. In many cases, the logic relationship between two or more conditions is either absent, or elementary. In consequence, according to one of its aspects the invention provides that uniform-directedly as starting from any cell for any sub-path emanating therefrom its associated delay is accumulated, which sub-path upon exceeding by said delay a predetermined integer number of said clock periods is signalled for subsequent provision with such integer number of flipflops and thereupon its accumulation is terminated, and in that subsequently all elementary cell-to-cell connections are provided with flipflops in minimal accordance with said signalling. Now, the predetermined number of clock pulse periods may be fixed at one, two or more. In particular, the fixed threshold at "one" requires the least amount of processing memory. Solutions with a higher threshold often need fewer flipflops inserted in the circuit. Alternative to a fixed threshold, the integer number may be pathwise assigned within a range. For higher values, each path may be prosecuted as far as it exists, or as far as delay determination is relevant. The termination may occur at the end of the integrated circuit, upon arriving at a circuit loop (because the prosecution of the delay aggregation would result in nonsense), at the end of a functional module, or otherwise. Often, aggregation between a particular node pair would be executed many times, leading to high memory requirements.

Accordingly, when said predetermined integer number is pathwise assigned within a range that includes plurals, and in case of existence of a multiple sub-path pattern between two particular cells terminating any such sub-paths's further accumulation in favour of the ones having highest accumulation result upon arrival at the converging cell among said two cells, said accumulation being the delay normalized versus the clock period diminished with the path's inherent weight. The aggregation is prosecuted only for the path that needs the highest amount of additional flipflops, the weight of a path being the number of flipflops that have already been introduced for functional reasons: these are needed for realizing the functionality per se. It has been found that this method, while ultimately realizing a better result than uniformly holding the predetermined number at one, needs less computer time/storage than persevering at each respective as long as possible.

The invention also provides for an apparatus for executing the method. The invention also relates to an electronic circuit configuration produced by executing the method according to the invention.

BRIEF DESCRIPTION OF THE FIGURES.

Further aspects and advantages of the invention will become apparent through a description of preferred embodiments as illustrated by the appended drawing, wherein:

FIG. 4 shows an example of a circuit and its timing model;

FIG. 5 shows various delays associated with FIG. 4;

FIG. 7 demonstrates various refinements to the solution.

DESCRIPTION OF A PREFERRED EMBODIMENT

Figure 1A:
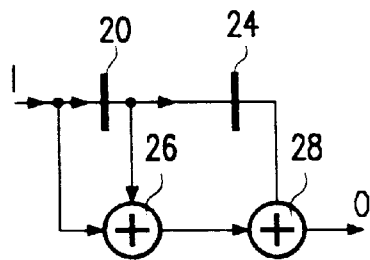
FIGS. 1a, 1b show a circuit before and after pipelining.
Figure 1B:
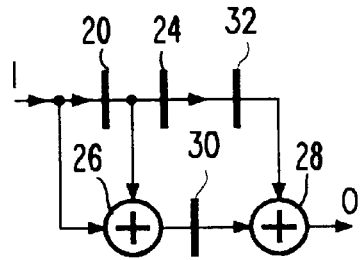

FIGS. 1a, 1b show a simple circuit before and after pipelining. As shown in FIG. 1a, there is a signal input I, a signal output O, two flipflops 20, 24, and two combinatorial elements 26, 28, which are shown as EXOR's, but which in principle may comprise any feasible logic or arithmetic function without clocked delays. As explained supra, even this latter limitation is not essential. For simplicity the clock inputs of the flipflops have not been shown. Through the two flipflops, the circuit may store three successive states. At low clock frequency, the delay produced by the two arithmetic elements in series is less than the clock pulse period. At higher frequency this is no longer guaranteed, and thus FIG. 1b has an additional flipflop 30 interposed between elements 26, 28. Extra flipflop 32 is necessary for timing alignment among the outputs of flipflop 24 and combinatorial element 26.

Figure 2A:
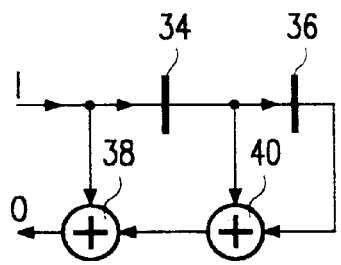
FIGS. 2a, 2b show a circuit before and after retiming.
Figure 2B:
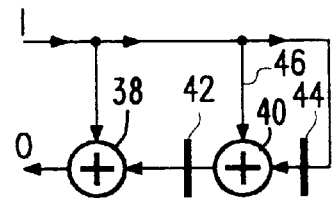

FIGS. 2a, 2b show a simple circuit before and after retiming. Generally, similar circuit elements are present as in FIGS. 1a, 1b. In retiming, flipflops are shifted along an interconnection. If in doing so, the interconnection forks out into two or more different lines, the flipflop divides up into as many instances, one for every line. Likewise, if two or more flipflops move along parallel lines that join into a single line, those flipflops converge to a single flipflop that moves along the single line. Therefore, the transition from FIG. 2a to FIG. 2b is done in two steps: first, flipflop 34 moves forward and splits into two flipflops, one in series with flipflop 36 and the other on interconnection 46. Next, the latter flipflop and flipflop 36 move forward and join between combinatorial elements 38 and 40 as flipflop 42. Flipflop 44 has now been shifted without further amendation. As mentioned, the description as a pipelining operation is in fact a subset of a retiming operation. FIG. 1b can be described as the result of a retiming operation through moving backwards of a flipflop at output O in combination with its splitting after passing the joint that is implicitly represented in combinatorial element 28. It would be easy to see, however, that the set up of FIG. 2b is the best, inasmuch as the timing constraints are also met in FIG. 2b (flipflop between the two combinatorial elements 38, 40), and the number of flipflops is minimal (2 versus 4 in FIG. 1b).

Figure 3:
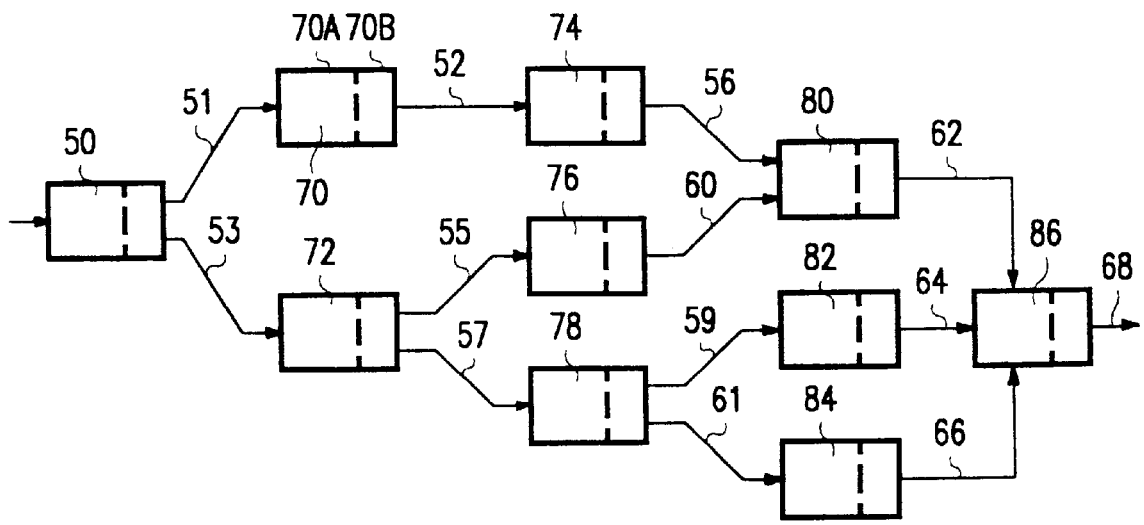
FIG. 3 shows a system of nets and interconnections.

FIG. 3 shows a system of cells and interconnections, for demonstrating the method according to the present invention. The electronic technology is irrelevant, but generally the whole circuit is executed as a single integrated chip or part thereof. The circuit has cells 50,70 . . . 84, that are shown as rectangles. Furthermore, the figure shows a number of cell-to-cell interconnections 51,52,53,55,56,57,59,61, 62,64,66, and output interconnection 68. The set of cells may realize any arbitrary combinatorial logic function, according to the intended overall functionality of the circuit, and each cell realizing an appropriate part thereof. The cells are shown as having no internal accessibility, but this restriction is not essential. Each cell may be realized as an associated library element according to an appropriate representation for a computer-aided design environment. The data flow is generally from left to right. The interconnections are each represented between two cells. In practice, any physical interconnection may of course interconnect three or more cells, but FIG. 3 as shown is intended solely for the assignment of the accumulated delays. Each cell may have one or more physical input interconnections and one or more output interconnections. In practice, the circuit is much more extended. There may be circular paths, such as from an output from cell 78 back to an input of the same cell, or according to a more complex arrangement. There may also be provided various register- or flipflop-type elements even before application of the present invention, compare FIGS. 1, 2.

For simplicity, the signal delays have been lumped at the cells, although this restriction is not really necessary. Each cell has been shown as a small square, such as 70A. This represents the signal delay of the cell proper. Furthermore, to each cell has been also attributed the delay of its next successive interconnection, such as block 70B representing the delay of interconnection 52. In case two or more interconnections emanate from a particular cell, the right hand block of the cell in question thus represents as many delay times as there are output interconnections. The respective output delays from a particular cell may be equal or not. It would be likewise feasible to lump the interconnection delays to the respective inputs of the cells. In this case, the interconnection delays should of course be positioned at the other side of functional delays such as represented by block 70A.

Now, according to the present invention, the processing starts from the cells present in the circuit. The processing direction is supposed to be uniform-directedly along with the data flow, so from left to right. The opposite direction would give the same result. Any interconnection emanating from the particular cells is followed. From cell 50, there are first two interconnections 51 and 53, leading to cell 70 and cell 72, respectively. Each such cell represents a respective delay. Now the delay of cells 50 and 70 is accumulated on the one hand, and the delay of cells 50 and 72 on the other hand. Next, the accumulation results are compared with an intended clock pulse period. It is understood that all cells and subsequent elementary interconnections combined have a delay below the clock pulse period. Now whenever during the analysis, the accumulated sum becomes equal to or greater than the clock pulse period, the sub-path in question is marked for insertion of a clock driven flipflop, generally a D-type flipflop. This marking pertains to the whole sub-path that had contributed to the accumulation result. The accumulation process as described proceeds further to the right. As from cells 70 and 78, further branchings occur. Now, assume that after cell 74 the accumulation result surpasses the clock pulse period, at that point a flipflop signalled for insertion in the sub-path constituted by the sequence of cells 50, 70, 74, and the accumulation is stopped. By itself, the accumulation could go on until a somewhat higher number of clock pulse periods were attained, but this would complicate the decisions and not produce a better result. However, it is commensurate with the essential idea of the invention, in that the accumulation is stopped as controlled by the attaining of a particular predetermined accumulation value. In the same way as described hereabove, the accumulation starts from the other cells shown in FIG. 3. For this elementary circuit there would thus be ten accumulation results produced, which need not all give an accumulation result that were surpassing the clock pulse period, because certain accumulations would stop upon reaching an output terminal of the circuit.

FIG. 7 demonstrates various refinements to the solution. The Figure shows two interconnections that start from a single cell 100. This cell, represented in the same way as in FIG. 3, may in fact represent an aggregated cell, such as the sequence of cells 50, 72, 78 in FIG. 3. Now, if the two interconnections 102, 104, directly or indirectly, reconverge to the same cell 106, the accumulation results are compared both to the clock pulse period, and to each other. If none of them surpasses the clock pulse period, the subsequent processing may be simplified, in that only for the higher accumulation result the further accumulation is effected. This also applies if behind cell 106 a further branching would occur. This means that the predetermined integer number is equal to one. The signalling that at least one flipflop should be positioned, applies however, separately to the sub-path of which interconnection 102 forms a part as well as to the sub-path comprising interconnection 104.

The above reconvergence problem is relatively important if the circuit is complicated. If the accumulation of the delay is continued past the attainment of the clock pulse period, the situation is somewhat more complicated and various approaches can be followed. It should be noted that the delay D of a path only is caused by the non-flipflop elements of that path. In addition, the basic circuit functionality of a path may by itself dictate the positioning of a flipflop when the input precedes the flipflop. Otherwise, the delay listed is between the input and the output of the highest level of significance adder. The number of successive such flipflops in a path is the weight W of the path p in question when the flipflop precedes the output. Otherwise, the delay listed is between an input of the lowest level of significance adder and the output. Now, the label of a path consists of a delay, and a weight representing one of the reconverging paths, between input and output of the path in question. Now, relevant path labelling goes as follows. On all paths that reconverge together, the same number of register flipflops must be present after retiming. A relevant path between two cells or operations is the path on which the largest number of registers must be added. This number is {D/C-W}, wherein C is the clock pulse period and W the weight that is the number of registers present beforehand. Now, upon arrival at a reconverging cell, the path with the highest value of the above number is accumulated further, whereas the accumulation for the other reconverging paths may be terminated. This diminishes appreciably the requirements on computer capability.

In this way a set of fliptlops will get signalled for positioning in the circuit of FIG. 3, wherein the highest delay between any two successive flipflops need never be higher than the clock pulse period. A similar procedure may be executed when starting from the righthand side and accumulating the partial delays as going back in time. Next, first the set of conditions found is solved to get a set of actually positioned flipflops. Finally, the flipflop positions so signalled are subjected to a retiming and possibly pipelining procedure as explained with respect to FIGS. 1a, 1b, 2a, 2b. Retiming, however, is essentially a local procedure and therefore, only little time-consuming.

FIG. 4 shows an example of a circuit and its timing model. The circuit is a three-bit adder that comprises a half-adder ha and two full-adders fa. Each of the adders is a combinatorial circuit that receives two input bits a,b, and outputs a sum bit s, and also a carry to the next higher level of significance, whereas the highest level of significance produces an output carry. Moreover, a flipflop in the now conventional notation has been inserted in the carry path between the two most significant stages. By way of example, all adders are presumed to introduce a uniform delay of 5 (arbitrary units). In FIG. 5 the top row lists the various inputs N. The second row lists the weight (number of flipflops) with respect to a reference position that is the highest significance level adder of the circuit. The third row lists the delay between input in question and the flipflop. Likewise, the most-left column lists the outputs, then the weights with respect to the highest significance level adder, then the delay between the flipflop and the output in question. The remainder of the table lists the delay between an input-output pair, that may be 5, 10, or un (-undecided). The undecided situation may evolve from the interposed flipflop, such as between a0 and s2, or because of irrelevance of the relation between the two, such as between b1 and s0. By itself, the circuit in question has been published in A. van der Werf et al., Hierarchical Retiming Including Pipelining, Proceedings VLSI 1991; the reference did not approach the operations prior to such retiming according to the present invention. The circuit has been included herein, inter alia to show the feasibility of the present invention both with and without sequential-operating cells.

DESCRIPTION OF THE DECOMPOSITION

Figure 6:
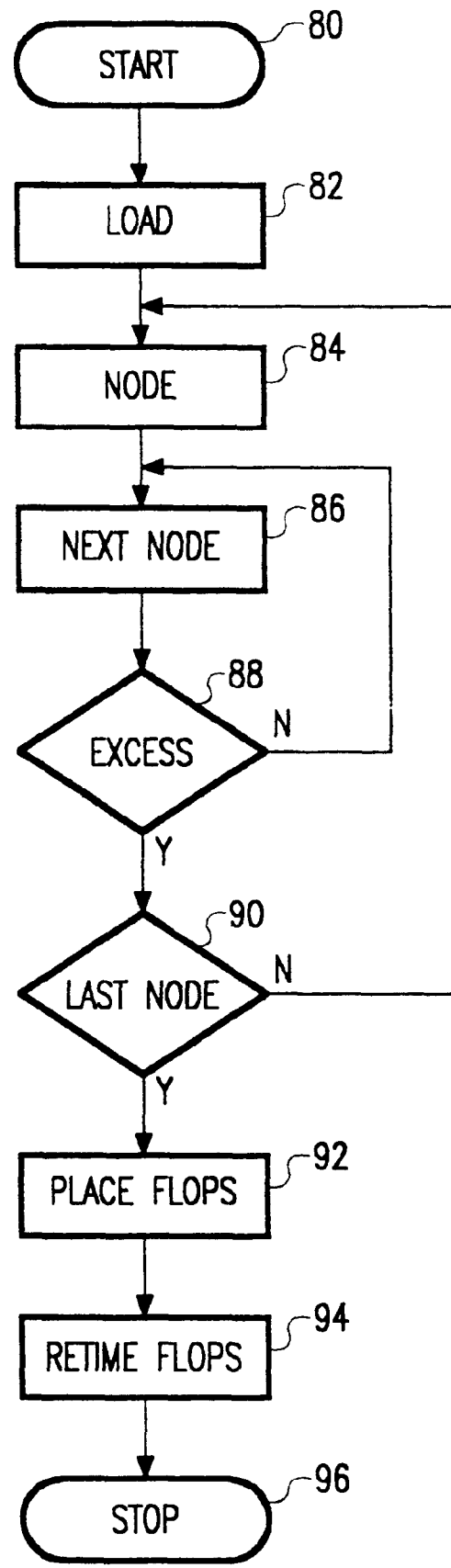
FIG. 6 shows a flowchart for implementing the invention.

FIG. 6 shows a flowchart for implementing the invention. Block 80 symbolizes the start of executing the method, with its conventional initialization. In block 82 the circuit description is loaded, along with associated parameters as exemplified with respect to FIGS. 4, 5. The cells are sequenced, for example, as a numbered list, whereas each cell entry has been provided with pointers to the previous cell or cells and to the subsequent cell or cells in the interconnection pattern of the circuit. In block 84, the first list cell is accessed. In block 86 by means of the pointers stored with the cell in question—that by themselves with respect to this particular cell are represented as a sequential list—its next cell is accessed and the delay for this particular path is accumulated. In block 88 there is detected whether the accumulation exceeds the clock period. If yes, the sub-path in question is marked for getting a flipflop and its processing is terminated. If no, the system goes back to block 86 for accessing the next cell. The search block 86 is organized according to a tree, wherein termination of a sub-path controls a jump back to the most recent cell where an as yet unexplored sub-path had started. By itself, tree searches are well known and no further expose is deemed necessary. If all sub-paths have terminated, the process in block 90 detects whether the list of cells has been treated completely. As long as the answer is no, the system goes back to block 84 for accessing the next cell of the sequence. This means that each cell figures only once as the start of a bundle of sub-paths; however it may be visited several times through the starting at other cells. If the sequence of cells is exhausted, the system goes to block 92 for positioning the flipflops through a search process, wherein logic functions are implemented with respect to the inter-cell stretches of the various sub-paths. For example, if sub-path I consists of stretches a, b, c, and sub-path II of stretches c, d, and e, the easiest way to provide both sub-paths with a flipflop is at stretch c. Because the sub-paths are relatively short, i.e. shorter than a two clock pulse period's travel, the nature of the logic functions so produced is simple. By itself, the placement algorithm has been described in the Leiserson et al. reference. Once the flipflops have been placed, in block 94 they are retimed in a way that by itself is standard, as has been explained with respect to FIGS. 2a, 2b. Finally, in block 96 the process stops, for example, while outputting a list of flipflops and their positions after retiming.

At this point the description once more reverts to FIG. 7. Previously, the two interconnections had been considered as representing only a delay. The simplest realization thereof is of course as a wire in one of its technologically feasible implementations. Furthermore, it could contain certain passive elements, such as a resistor. By itself, elementary logic elements as well could constitute part of the interconnection. FIG. 7 goes one step further in that one or both of the interconnections may contain one or more flipflops that by themselves are not counted in the accumulating process described supra. If such flipflop had already been present in the original design, its presence is taken into account after the accumulating and the solving of the conditions that would indicate where a flipflop should be inserted. Any flipflop already present would be taken into account therein. Now, if during the accumulation, the situation of FIG. 7 is encountered, i.e. branching off and converging of two or more paths (such as from cell 50 to cell 80 in FIG. 3), the following happens. First, the number of flipflops in the interconnections is counted. If their numbers differ, only the accumulation for the sub-path having the lowest weight or number of flipflops is carried on. Only if the numbers are all equal (including zero), the accumulating for the highest result is continued. Various procedural shortcuts may be implemented to the elementary example of FIG. 6. For one, if the accumulating reaches a cell where converging takes place, the accumulating may halt until all other sub-paths converging at this particular node have been followed, before deciding whether or not to go on.

As stated earlier, according to the relevant path approach, after the marking of a sub-path for the insertion of a flipflop, the accumulation of D/C-W may go on, and each time the accumulation passes a next integer value, a next flipflop insertion is signalled. At a converging cell, the accumulation results are compared, and only the highest value is taken as a basis for further accumulation.

Now, implementation of the above in an apparatus, preferably a programmed digital computer, is straightforward. First a description of the circuit is loaded in the memory. Next, for each path or sub-path the delays are accumulated, taking into account the weight or not, as explained supra. A simple addition is effected thereto. Next, a discrimination versus the preset threshold is effected. If discrimination is positive, a flipflop is inserted. Finally, the result so acquired is outputted.

I claim:

1. A method for designing data paths in an electronic digital circuit that comprises an in-circuit collection of logic cells interconnected by nets of data paths, wherein each respective logic cell of the circuit imparts a respective data signal delay to respective data paths between an input\output pair of the respective logic cell, said method comprising the steps of:

accumulating a respective data signal delay for specified data paths which start in a uniform direction, said data paths comprising data sub-paths, from each logic cell for each data sub-path emanating therefrom and which comprises at least one further logic cell;

setting a threshold for the data signal delay for each respective data sub-path, each threshold being an associated predetermined number of clock pulse periods of an intended clock frequency and upon reaching the associated predetermined number, terminating the accumulating for the respective data sub-path; and providing collective data sub-paths of said nets with flipflops to be clocked by said clock frequency in minimal accordance with the threshold such that each respective data sub-path is provided with at least a number of flipflops equal to the associated predetermined number.

2. A method as claimed in claim 1, wherein said associated predetermined number is equal to one.

3. A method as claimed in claim 2, further comprising the step of:

when multiple sub-paths exist between two particular cells, terminating any further accumulation, of a respective sub-path of the multiple sub-paths, of an associated delay in favor of the sub-paths having lowest weight upon arrival at a converging cell of the two particular cells.

4. A method as claimed in claim 3, further comprising the step of:

performing a subsequent node-wise search operation on one or more selective flipflops present while adhering to a timing constraint condition represented by said threshold.

5. An apparatus for implementing the method as claimed in claim 4, said apparatus comprising:

input means for receiving a circuit description;

delay summing means fed by said input means for pathwise aggregating signal delays therein;

discrimination means fed by said summing means for discriminating said delay with a threshold integer; and flipflop inserting means fed by said discriminating means for inserting flipflops in said description in minimal accordance with surpassing of said threshold integer.

6. A method as claimed in claim 2, further comprising the step of:

performing a subsequent node-wise search operation on one or more selective flipflops present while adhering to a timing constraint condition represented by said threshold.

7. An apparatus for implementing the method as claimed in claim 2, said apparatus comprising:

input means for receiving a circuit description;

delay summing means fed by said input means for pathwise aggregating signal delays therein;

discrimination means fed by said summing means for discriminating said delay with a threshold integer; and flipflop inserting means fed by said discriminating means, for inserting flipflops in said circuit description in minimal accordance with surpassing of said threshold integer.

8. A method as claimed in claim 1, wherein if multiple data sub-paths exist between two particular cells, said method further comprises the step of:

terminating any further accumulation of a respective associated delay of a data sub-path of the multiple data sub-paths in favor of a data sub-path of multiple data sub-paths having a lowest weight upon arrival at a converging cell of said two particular cells.

9. A method as claimed in claim 8, further comprising the step of:

performing a subsequent node-wise search operation on one or more selective flipflops present while adhering to a timing constraint condition represented by said threshold.

10. An apparatus for implementing the method as claimed in claim 8, said apparatus comprising:

input means for receiving a circuit description;

delay summing means fed by said input means for pathwise aggregating signal delays therein;

discrimination means fed by said summing means for discriminating said delay with a threshold integer; and flipflop inserting means fed by said discriminating means for inserting flipflops in said circuit description in minimal accordance with surpassing of said threshold integer.

11. A method as claimed in claim 1, wherein said predetermined number is pathwise assigned within a range that includes plurals and if multiple data sub-paths exist between two particular cells, terminating any further accumulation of a respective associated delay of a data sub-path of the multiple data sub-paths in favor of a data sub-path of a multiple data sub-path having the highest accumulation result upon arrival at a converging cell of said two particular cells, said accumulation being the respective associated delay normalized versus a clock period diminished with an inherent weight of a data path.

12. A method as claimed in claim 11, further comprising the step of:

performing a subsequent node-wise search operation on one or more selective flipflops present while adhering to a timing constraint condition represented by said threshold.

13. An apparatus for implementing the method as claimed in claim 11, said apparatus comprising:

input means for receiving a circuit description;

delay summing means fed by said input means for pathwise aggregating signal delays therein;

discrimination means fed by said summing means for discriminating said delay with a threshold integer; and flipflop inserting means fed by said discriminating means for inserting flipflops in said description in minimal accordance with surpassing of said threshold integer.

14. A method as claimed in claim 1, further comprising the step of:

performing a subsequent node-wise search operation on one or more selective flipflops present while adhering to a timing constraint condition represented by said threshold.

15. An apparatus for implementing the method as claimed in claim 14, said apparatus comprising:

input means for receiving a circuit description;

delay summing means fed by said input means for pathwise aggregating signal delays therein;

discrimination means fed by said summing means for discriminating said delay with a threshold integer; and fliptlop inserting means fed by said discriminating means for inserting flipflops in said description in minimal accordance with surpassing of said threshold integer.

16. An apparatus for implementing the method as claimed in claim 1, said apparatus comprising:

input means for receiving a circuit description;

delay summing means fed by said input means for pathwise aggregating signal delays therein;

discrimination means fed by said summing means for discriminating a delay with a threshold integer; and flipflop inserting means fed by said discriminating means, for inserting flipflops in said circuit description in minimal accordance with surpassing of said threshold integer.

17. A synchronous digital electronic circuit designed according to the method as claimed in claim 1, said circuit comprising:

in-circuit data paths formed by a collection of logic cells and clocked flipflops interconnected by nets and running at a predetermined clock period, wherein each logic cell of said circuit imparts to a data path between an input/output pair of the logic cell, a respective signal delay; and in-circuit data paths imparting a total delay due to said logic cells of said circuit exceeding a predetermined integer number times said clock period by less than a full clock period, are provided with at least said predetermined integer number of flipflops.

* * * * *